(12) United States Patent
Amanuma

(10) Patent No.: US 6,188,098 B1
(45) Date of Patent: Feb. 13, 2001

(54) SEMICONDUCTOR DEVICE AND METHOD OF MANUFACTURING THE SAME

(75) Inventor: Kazushi Amanuma, Tokyo (JP)

(73) Assignees: Symetrix Corporation, Colorado Springs, CO (US); NEC Corporation (JP)

(*) Notice: Under 35 U.S.C. 154(b), the term of this patent shall be extended for 0 days.

(21) Appl. No.: 09/178,620

(22) Filed: Oct. 26, 1998

(30) Foreign Application Priority Data

Oct. 31, 1997 (JP) .................................................. 9-299789

(51) Int. Cl.[7] .......................... H01L 27/108; H01L 29/94
(52) U.S. Cl. ........................ 257/306; 257/296; 257/303; 257/304; 257/310; 257/311; 438/396
(58) Field of Search .................................. 257/296, 303, 257/304, 306, 310, 311; 438/393, 396

(56) References Cited

U.S. PATENT DOCUMENTS

| | | | |
|---|---|---|---|
| 5,481,490 | 1/1996 | Watanabe et al. | 365/145 |
| 5,523,595 | 6/1996 | Takenaka et al. | 257/295 |
| 5,793,076 * | 8/1998 | Fazan et al. | 257/298 |

FOREIGN PATENT DOCUMENTS

| | | |
|---|---|---|
| 0 766 319 A2 | 4/1997 | (EP) . |
| 7-111318 | 4/1995 | (JP) . |
| 7-273297 | 10/1995 | (JP) . |
| 9-97883 | 4/1997 | (JP) . |
| 9-246497 | 9/1997 | (JP) . |
| 11-8355 | 1/1999 | (JP) . |

OTHER PUBLICATIONS

Article: H. Achard and H. Mace; "Integration of Ferroelectric Thin Films For Memory Applications"; Science and Technology of Electroceramic Thin Films; Kluwer Academic Publishers, 1995; pp. 353–372; inclusive.

* cited by examiner

*Primary Examiner*—Olik Chaudhuri
*Assistant Examiner*—Ginette Peralta
(74) *Attorney, Agent, or Firm*—Duft, Graziano & Forest, P.C.

(57) ABSTRACT

A semiconductor device has a device isolation oxide film, an interlayer insulating film, hydrogen barrier films, a lower electrode, a capacitor insulating film, an upper electrode, an interlayer insulating film and a wiring layer, formed on a silicon substrate. A gate electrode is formed on a gate oxide film between impurity diffusion regions in the silicon substrate. Further, a capacitor portion, comprising the lower electrode, the capacitor insulating film (ferroelectric or high dielectric substance) and the upper electrode, is completely covered with the hydrogen barrier films. The hydrogen barrier films prevent deterioration of the ferroelectric substance and the high dielectric constant material due to reducing conditions in a hydrogen atmosphere. Other device characteristics, however, are not adversely affected because only the capacitor portion is completely covered with the hydrogen barrier films.

9 Claims, 8 Drawing Sheets

US 6,188,098 B1

SEMICONDUCTOR DEVICE AND METHOD OF MANUFACTURING THE SAME

BACKGROUND OF THE INVENTION

1. Field of the Invention

The present invention relates to a semiconductor device in which a ferroelectric substance material or a high dielectric constant material is mainly used as a capacitor insulating film and a method of manufacturing the same.

2. Statement of the Problem

Recently, development has been made in the area of semiconductor devices concerning a non-volatile memory having a capacitor device region in which a ferroelectric substance material, such as $Pb(Zr,Ti)O_3$ and $SrBi_2Ta_2O_9$, having a hysteresis characteristic is used as a capacitor insulating film, and concerning a dynamic random access memory in which a capacitor device region has a large quantity of stored electric charges by using a high dielectric substance material, such as $(Sr,Ba)TiO_3$, as the capacitor insulating film.

It has been known that deterioration of an insulating characteristic and a ferroelectric characteristic occurs in the dielectric substance, such as $Pb(Zr,Ti)O_3$ and $(Sr,Ba)TiO_3$, used in the above semiconductor device, when the dielectric substance is subjected to a reduction atmosphere because the dielectric substance is formed by an oxide. In particular, when the dielectric substance is exposed to hydrogen, the device characteristics deteriorate critically. In the extreme case, peeling of an electrode may be caused to occur.

However, a hydrogen atmosphere inevitably is produced in a manufacturing process of the semiconductor device, such as a large scale integrated circuit ("LSI"). For example, a $SiO_2$ film which is used as an interlayer insulating film is generally formed by the use of a chemical vapor deposition ("CVD") method. The reaction is represented by $SiH_4 + O_2 \rightarrow SiO_2 + 2H_2$. This reaction formula indicates that the hydrogen is generated as a reaction product. Further, the CVD of tungsten ("W") tends to be widely used to embed a contact hole having a large aspect ratio as the device size becomes small. In this case, the W is deposited by the reaction which is represented by $2WF_6 + 3SiH_4 \rightarrow 2W + 3SiH_4 + 6H_2$. This reaction formula indicates that the reaction is carried out in a very strong reduction atmosphere. In addition, an annealing process is performed in an atmosphere containing the hydrogen to ensure the characteristic of a MOS transistor after the formation of an Al wiring pattern.

Means for preventing the dielectric capacitor from deteriorating due to the hydrogen has been adopted in several semiconductor devices, as known in the art. For example, disclosure is made in Japanese Unexamined Patent Publication No. H4-102367 of a semiconductor device, illustrated in FIG. 27, which has a TiN film or a TiON film formed on an interlayer insulating film 16 of a capacitor portion 19 as a hydrogen barrier film 17. In the structure illustrated in FIG. 27, a device isolation oxide film 2, an interlayer insulating film 6, a lower electrode 8, a capacitor insulating film 9, an upper electrode 10, an interlayer insulating film 13, a wiring layer 14, an interlayer insulating film 16, and a hydrogen barrier film 17 are successively deposited on a silicon substrate 1 in this order. Further, a gate electrode 5 is formed on a gate oxide film 4 between impurity diffusion regions 3 in the silicon substrate 1.

Alternatively, AlN or $Ti_3N_4$ is formed on an upper electrode 10 of a capacitor portion 19 as a hydrogen barrier film 11 in the structure illustrated in FIG. 28 in the case of a dielectric memory which is disclosed in Japanese Unexamined Patent Publication No. H7-111318. On the other hand, $Si_3N_4$ is formed on the entire surface of the device as a hydrogen barrier film 12 in the structure illustrated in FIG. 29.

More specifically, a device isolation oxide film 2, an interlayer insulating film 6, a lower electrode 8, a capacitor insulating film 9, an upper electrode 10, a hydrogen barrier film 11, an interlayer insulating film 13 and a wiring layer 14 are successively deposited on a silicon substrate 1 in this order in the structure illustrated in FIG. 28. Further, a gate electrode 5 is formed on a gate oxide film 4 between impurity diffusion regions 3 in the silicon substrate 1. In the structure illustrated in FIG. 29, a device isolation oxide film 2, an interlayer insulating film 6, a lower electrode 8, a capacitor insulating film 9, an upper electrode 10, a hydrogen barrier film 11, a hydrogen barrier film 12, an interlayer insulating film 13 and a wiring layer 14 are successively deposited on a silicon substrate 1 in this order. In this case, the hydrogen barrier film 12 is formed to cover the lower electrode 8, the capacitor insulating film 9, the upper electrode 10 and the hydrogen barrier film 11. In addition, a gate electrode 5 is formed on a gate ode film 4 between impurity diffusion regions 3 in the silicon substrate 1.

Where the hydrogen barrier film 17 is formed on the interlayer insulating film 16 of the capacitor portion 19 like the conventional semiconductor device illustrated in FIG. 27, the hydrogen barrier film 17 must cover the capacitor portion 19 with a space area of several microns or more from the capacitor portion 19 to prevent the invasion of the hydrogen from a lateral direction. However, cell area has been reduced with the high integration of memories, and the cell area of a highly integrated memory of 256 Megabit or more is 1 $\mu m^2$ or less, as disclosed in Nikkey Micro Device, March 1995, at page 31. In such a case, the area of the hydrogen barrier film 17 over the capacitor portion 19 must be equal to or less than the cell area. Consequently, the invasion of the hydrogen from the lateral direction cannot sufficiently be prevented. In addition, the conventional semiconductor device is not effective at all for avoiding deterioration of the capacitor portion 19 due to the hydrogen where CVD of W is used for the wiring layer, since the hydrogen barrier film is formed over the wiring layer 14.

Further, the other conventional semiconductor device illustrated in FIG. 28 is not effective at all for avoiding the invasion of the hydrogen from the side portion. In addition, the characteristic of the MOS transistor which is ensured by the hydrogen anneal is hindered after the formation of the Al wiring pattern in the other conventional semiconductor device illustrated in FIG. 29, since the $Si_3N_4$ film is formed for the entire surface of the device. In this case, the hindrance of the hydrogen annealing effect from the formation of $Si_3N_4$ film has been widely known as described in PROCEEDINGS OF THE SYMPOSIUM ON SILICON NITRIDE THIN INSULATING FILMS, 1983, pages 94 to 110.

3. Solution to the Problem

In the semiconductor device according to this invention, the capacitor portion is directly covered with the hydrogen barrier film and further, the hydrogen barrier film, except for a part covering the capacitor portion, is removed. Consequently, the characteristic of the MOS transistor is not adversely affected, and the deterioration of the capacitor portion can be effectively avoided.

According to this invention, there is provided a semiconductor device which has a capacitor portion including a ferroelectric substance material or a high dielectric constant material as a capacitor insulating film. The capacitor portion is covered with a hydrogen barrier film, and the remaining portion excepting the capacitor portion is uncovered with the hydrogen barrier film.

A method of manufacturing the semiconductor device according to this invention includes a step of forming the capacitor portion comprising a lower electrode, a capacitor insulating film of ferroelectric substance material or high dielectric constant material and an upper electrode, a step of forming the hydrogen barrier film for covering the capacitor portion, and a step of removing a part of the hydrogen barrier film by etching.

A feature of the invention is a semiconductor device having a capacitor portion covered by a hydrogen barrier film, and a portion having no hydrogen barrier film.

Another feature of the invention is a contact portion on the capacitor portion, formed by removing a portion of hydrogen barrier film from the capacitor portion.

Another feature of the invention is a nonconductive hydrogen barrier film containing at least one material selected from the group consisting of $Si_3N_4$, SiON and a combination of $Si_3N_4$, SiON and $SiO_2$.

Another feature of the invention is an electrically conductive hydrogen barrier film comprising at least one material selected from nitrides of the group consisting of Ti, Zr, Nb, Ta, Hf and W.

Another feature of the invention is the utilization of an electrically conductive hydrogen barrier film as the upper electrode of a memory capacitor.

In a first basic embodiment, the invention comprises a substrate and a transistor portion having a gate oxide film on the substrate, a gate electrode on the gate oxide film, and an impurity diffusion region in the substrate. It further includes a capacitor portion containing a capacitor insulating film and having a surface. A hydrogen barrier film is located on the surface of the capacitor portion. A contact portion is formed on the surface of the capacitor portion by removing a portion of the hydrogen barrier film from the capacitor portion. The contact portion is for electrically contacting the capacitor portion to the transistor portion. The capacitor portion does not overlap the transistor portion.

In one variation of the first basic embodiment of the invention, a nonconductive hydrogen barrier film is formed on an interlayer insulating film, then a lower electrode and a capacitor insulating film are formed. Then an upper electrode and a conductive hydrogen barrier, or alternatively just a conductive hydrogen barrier serving also as an electrode, are formed. These films are patterned, and then the patterned surface is covered with a second nonconductive hydrogen barrier film. A contact hole is made in the second nonconductive hydrogen barrier film to form a contact portion on the conductive film below.

In another variation, the upper electrode is formed on the capacitor insulating film, the films are patterned to form a capacitor, then the second nonconductive hydrogen barrier film is formed to cover the surfaces of the capacitor. Then a portion of the nonconductive hydrogen is removed to form a contact hole and a contact portion on the upper electrode. Then a conductive hydrogen barrier film is formed to fill the contact hole and cover the contact portion and the top of the capacitor portion. Alternatively, an interlayer insulating film can be formed on the second nonconductive hydrogen barrier film, a contact hole made through both the interlayer insulating film and the second nonconductive hydrogen barrier film, and then the contact portion covered with the conductive hydrogen barrier film In another second basic embodiment, the invention comprises a substrate and a transistor portion having a gate oxide film on the substrate, a gate electrode on the gate oxide film, and an impurity diffusion region in the substrate. It further includes a plurality of capacitor portions, each having a lower electrode and a capacitor insulating film, each of the capacitor portions overlapping a transistor portion. Each capacitor portion is located over a plug, which is electrically connected to the transistor portion. A first, nonconductive hydrogen barrier film is formed on an interlayer insulating film. A second, electrically conductive hydrogen barrier film is formed on the first, nonconductive hydrogen barrier film and the plug. A lower electrode is formed on the second, conductive hydrogen barrier film. The lower electrode and the second, conductive hydrogen barrier film are patterned to form a patterned surface. The capacitor insulating film is formed on the patterned surface and then it is removed from the surface except not from the top and side surfaces of the capacitor portion. A third, conductive hydrogen barrier film is formed on the capacitor insulating layer and the first, nonconductive hydrogen barrier film. Then the third, conductive hydrogen barrier film and the first, nonconductive hydrogen barrier film are removed from the underlying interlayer insulating film, not from the capacitor portion. Thus, the capacitor portions are covered by hydrogen barrier film, but there is a portion between the capacitor portions that is not covered.

A first variation of the second basic embodiment includes a first, electrically nonconductive hydrogen barrier film formed on the plug and on the interlayer insulating film, as described above, but the capacitor insulating film is patterned in the same process as the third, conductive hydrogen barrier film and the nonconductive hydrogen barrier film. In a second variation, no nonconductive hydrogen barrier film is formed on the interlayer insulating layer, and a second, conductive hydrogen barrier film, the capacitor insulating film, and a first, conductive hydrogen barrier film are patterned in the same process.

A feature of the invention is that the capacitor insulating film may contain a ferroelectric substance material or a high dielectric constant material. The ferroelectric substance material is a ferroelectric metal oxide, such as $Pb(Zr,Ti)O_3$ and $SrBi_2Ta_2O_9$. The high dielectric constant material is a non-ferroelectric dielectric metal oxide, such as $(Sr,Ba)TiO_3$.

Numerous other features, objects and advantages of the invention will become apparent from the following description when read in conjunction with the accompanying drawings.

DETAILED DESCRIPTION OF THE PREFERRED EMBODIMENT

By reference to the drawings, a semiconductor device and a method of manufacturing the same in several embodiments is described herein.

It should be understood that the FIGS. 1–12, 15–26 depicting integrated circuit devices in accordance with the invention are not meant to be actual plan or cross-sectional views of any particular portion of an actual integrated circuit device. In the actual devices, the layers will not be as regular and their thicknesses may have different proportions. The various layers in actual devices often are curved and possess overlapping edges. The figures instead show idealized representations which are employed to depict more clearly and fully the method of the invention than would otherwise be possible. Also, the figures represent only one of innumerable variations of ferroelectric devices that could be fabricated using the method of the invention. For the sake of clarity, the same reference numbers have been used to identify similar elements among the different embodiments of the invention depicted in the figures.

As discussed in the problem statement above, the dielectric substance of the capacitor insulating film is an oxide that may be a ferroelectric oxide, such as $Pb(Zr,Ti)O_3$ and $SrBi_2Ta_2O_9$, or it may be a non-ferroelectric dielectric oxide, such as $(Sr,Ba)TiO_3$.

Figure 1:
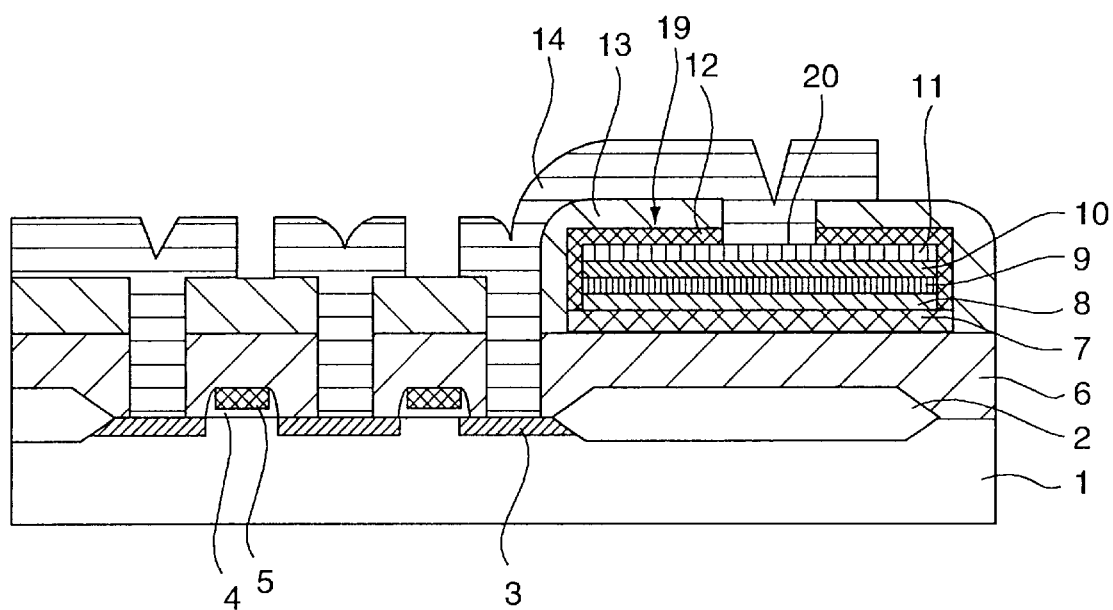
FIG. 1 is a side cross-sectional view showing a basic structure of a semiconductor device according to a first embodiment of this invention.

FIG. 1 is a side cross-sectional view showing a basic structure of a semiconductor device according to a first embodiment of this invention. In the structure of the semiconductor device, a device isolation oxide 2, an interlayer insulating film 6, a hydrogen barrier film 7, a lower electrode 8, a capacitor insulating film 9, an upper electrode 10, a hydrogen barrier film 11, a hydrogen barrier film 12, an interlayer insulating film 13 and a wiring layer 14 are deposited on a silicon substrate 1 with this order. The capacitor portion 19 comprising the lower electrode 8, the capacitor insulating film (dielectric film) 9 and the upper electrode 10 is completely covered with the hydrogen barrier films 7, 11, and 12. Further, a gate electrode 5 is formed on a gate oxide film 4 between impurity diffusion regions 3 in the silicon substrate 1. In this event, the characteristic of the capacitor portion 19 does not deteriorate during a manufacturing process in a reduction atmosphere after the formation of the capacitor portion 19 because the capacitor portion 19 is completely covered with the hydrogen barrier films 7, 11, and 12. Further, a MOS characteristic is effectively ensured by a hydrogen anneal, and Vt of the transistor is not fluctuated because the hydrogen barrier film is removed over the transistor.

FIGS. 2–9 are side cross-sectional views showing a method of manufacturing such a semiconductor device at the respective manufacturing steps.

Figure 2:
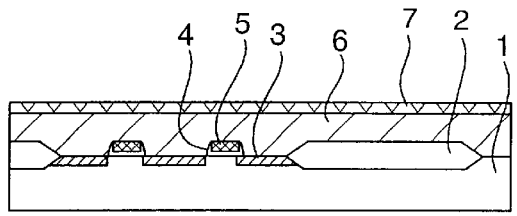
FIGS. 2–9 are side cross-sectional views showing a method of manufacturing the semiconductor device illustrated in FIG. 1 with each manufacturing step.
Figure 3:
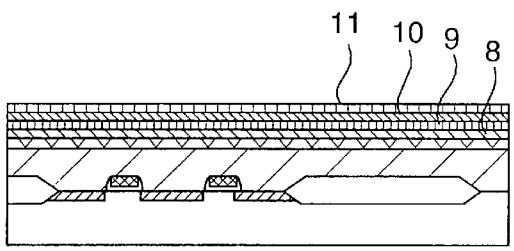

First, as shown in FIG. 2, a transistor portion is fabricated by forming the gate electrode 5 on the gate oxide film 4 between the impurity diffusion regions 3 in the silicon substrate 1 by use of a known CMOS process. Thereafter, a first interlayer insulating film 6 of a BPSG layer is formed, and a first hydrogen barrier film 7 having the film thickness of 100 to 2000 Å (for example, 500 Å) is formed on the interlayer insulating film 6. The hydrogen barrier film 7 is a $Si_3N_4$ film that is formed by using a reduced pressure CVD method or a sputtering method. If the film thickness is less than 100 Å, the hydrogen barrier film 7 does not provide sufficient barrier performance. On the other hand, if thickness exceeds 2000 Å, warping of the silicon substrate 1 occurs because of stress from the $Si_3N_4$ film. Therefore, thicknesses outside the range 100–2000 Å are undesirable. The $Si_3N_4$ film due to the reduced pressure CVD method is excessively dense and the content of the hydrogen is also small. Subsequently, as shown in FIG. 3, the lower electrode 8, the capacitor insulating film 9, the upper electrode 10 and a second hydrogen barrier film 11 are successively deposited on the barrier film 7. A contact layer, such as $SiO_2$, may be also formed between the hydrogen barrier film 7 and the lower electrode 8. For example, where a contact layer of NSG having a film thickness of 500 Å is formed on the hydrogen barrier film, a lower electrode 8 comprising a Ti film of 500 Å thickness and a Pt layer of 2000 Å thickness is deposited thereon by the use of a sputtering method. Further, the capacitor insulating film 9 having a film thickness of 2000 Å is formed by use of a sol-gel process. Thereafter, the upper electrode 10 of Pt having a film thickness of 200 Å and the hydrogen barrier film 11 of TiN having the film thickness of 500 Å are successively deposited thereon by a sputtering method. The barrier film 11 must be conductive so a conductive nitride, such as TiN and TaN, is used to form it. Further, the film thickness thereof is set to 100 Å or more to obtain a sufficient barrier performance.

Figure 4:
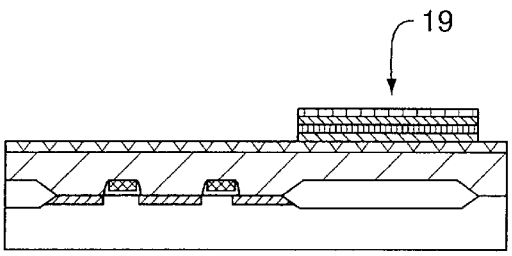

Then, as shown in FIG. 4, the hydrogen barrier film 11, the upper electrode 10, the capacitor insulating film 9 and the lower electrode 8 are processed by etching.

Figure 6:
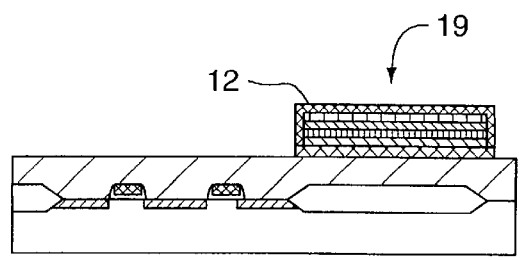
Figure 5:
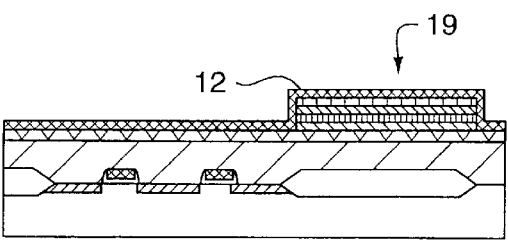

After a third hydrogen barrier film 12 is formed on the entire upper surface, as shown in FIG. 5, the hydrogen barrier film 7 and the hydrogen barrier film 12 over the transistor are removed by etching to obtain the condition illustrated in FIG. 6. For example, the hydrogen barrier film 12 of $Si_3N_4$ with a thickness of 500 Å is deposited by sputtering. Then, as shown in FIG. 6, the hydrogen barrier films 7 and 12 are removed from interlayer insulating film 6, but not from the capacitor portion 19.

Further, the hydrogen barrier film 12 is formed to the same thickness using $Si_3N_4$ as the hydrogen barrier film 7.

However, it is desirable to apply a sputtering method as the deposition method because the CVD method has a hydrogen atmosphere that deteriorates capacitance characteristics. Also, a multilayer of $Si_3N_4$ and $SiO_2$ or a film containing oxygen and nitrogen represented by SiON (namely, SiON or one selected from a group of $Si_3N_4$, SiON and $SiO_2$) is applicable for the hydrogen barrier film 12.

Figure 7:
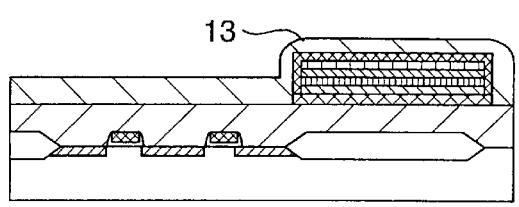
Figure 8:
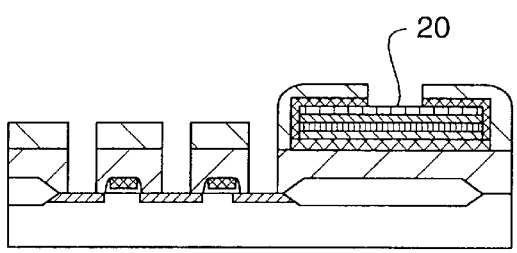
Figure 9:
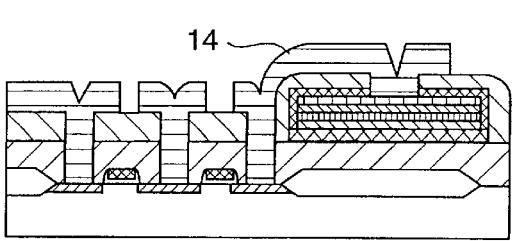

Next, as shown in FIG. 7, after a second insulating film 13 of $SiO_2$ is formed by the use of the CVD method, a contact hole is formed as shown in FIG. 8. After a W film is finally formed by the CVD method as shown in FIG. 9, W is embedded into a contact portion 20 by the etch back, and the wiring layer 14 of Al is deposited and patterned. Thereafter, the hydrogen anneal is carried out at 400° C. to form a protection film on the wiring layer 14.

Figure 10:
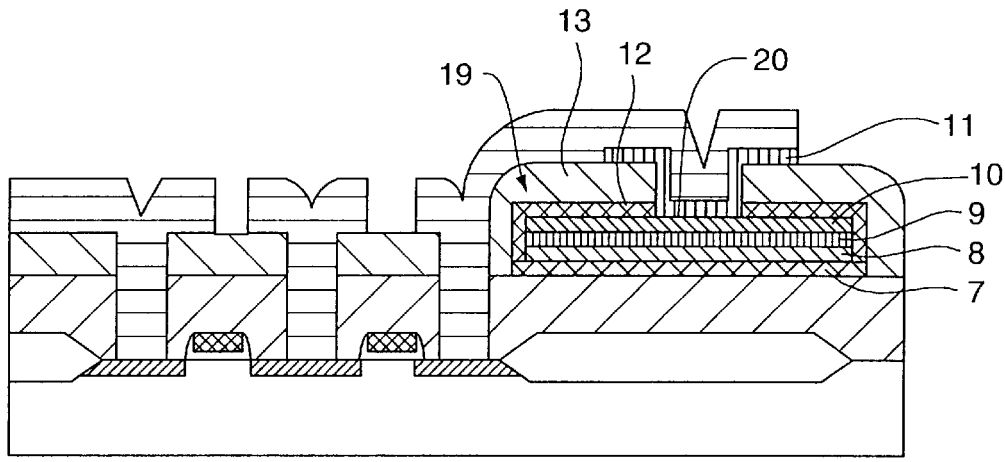
FIG. 10 is a side cross-sectional view showing a basic structure of a modified embodiment of the semiconductor device illustrated in FIG. 1.

FIG. 10 is a side cross-sectional view showing a basic structure with respect to a modification of the semiconductor device illustrated in FIG. 1. In such a semiconductor device, a sequence for forming the hydrogen barrier is different from the semiconductor device illustrated in FIG. 1. Namely, in this example, the second barrier film 11 is formed after the second interlayer insulating film 13 is formed and the contact hole is etched. Thereafter, the second hydrogen barrier film 11, except over the capacitor portion 19, is removed. The same structure as the semiconductor device illustrated in FIG. 1 can be obtained by the above manufacturing method.

In the structure illustrated in FIG. 1, a heat treatment of a high temperature in an atmosphere containing oxygen cannot be performed because the capacitor insulating film 9 is insulated from oxidation after the formation of the second hydrogen barrier film 11. However, the capacitance characteristic can be improved by performing an oxygen anneal after processing the capacitor insulating film 9, because the second hydrogen barrier film 11 is not formed at the same time as the capacitor insulating film 9 in this structure.

Figure 11:
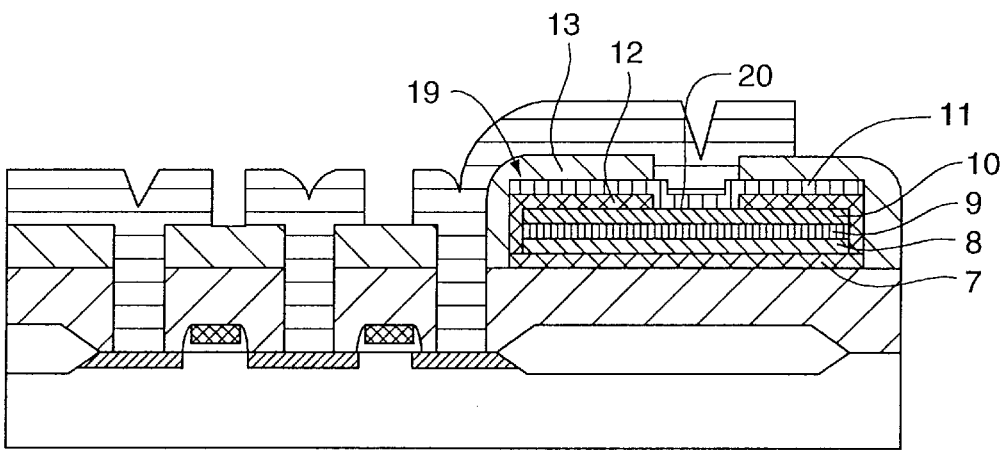
FIG. 11 is a side cross-sectional view showing a basic structure of another modified embodiment of the semiconductor device illustrated in FIG. 1.

FIG. 11 is a side cross-sectional view showing a basic structure according to another modification example of the semiconductor device illustrated in FIG. 1.

In such a semiconductor device, the second hydrogen film 11 is formed after the third hydrogen barrier film 12 is formed and the contact hole of the capacitor portion 19 is etched. Thereafter, in contrast to the semiconductor device illustrated in FIG. 1, the hydrogen barrier films 11 and 12, except on the capacitor portion 19, are removed. A structure equivalent to the semiconductor device illustrated in FIG. 1 can be obtained by the above manufacturing method.

Figure 12:
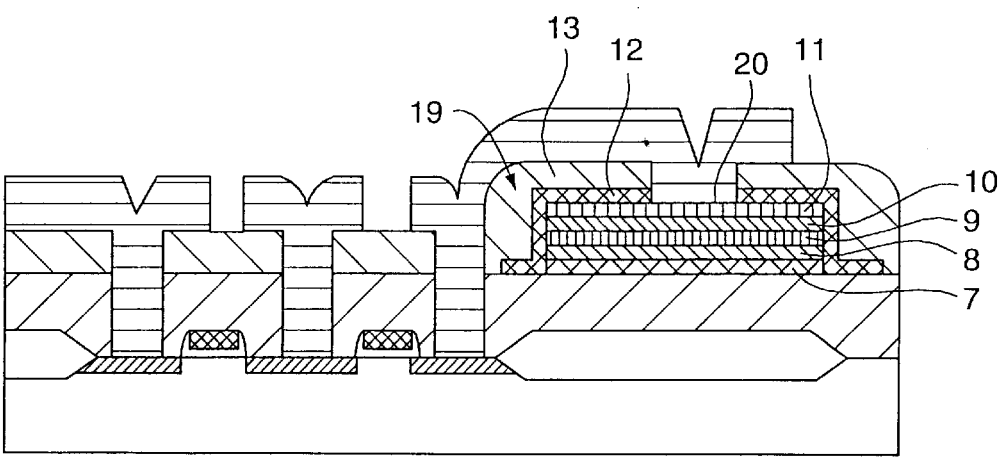
FIG. 12 is a side cross-sectional view showing a basic structure of still another modified embodiment of the semiconductor device illustrated in FIG. 1.

FIG. 12 is a side cross-sectional view showing a basic structure according to another modification of the semiconductor device illustrated in FIG. 1. In such a semiconductor device, in contrast to the semiconductor device illustrated in FIG. 1, the first hydrogen barrier film 7 is etched simultaneously with the lower electrode 9. A structure equivalent to the semiconductor device illustrated in FIG. 1 can be obtained by this manufacturing method.

Figure 13:
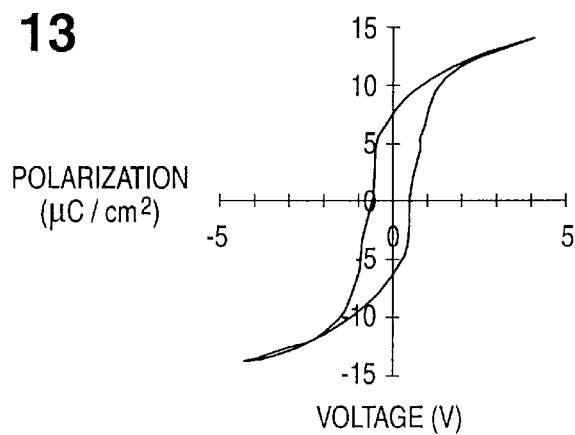
FIG. 13 shows results from measuring of hysteresis in a capacitor device portion before and after hydrogen anneal of the semiconductor device illustrated in FIG. 1.

FIG. 13 shows the result of measuring the hysteresis curve [polarization ($\mu C/cm2$) as a function of voltage(V)] of the capacitor device portion before and after the hydrogen anneal for the semiconductor device illustrated in FIG. 1. The capacitor insulating film comprised $SrBi_2Ta_2O_9$. The resulting curve shows that almost no deterioration due to the hydrogen anneal occurred.

Figure 14:
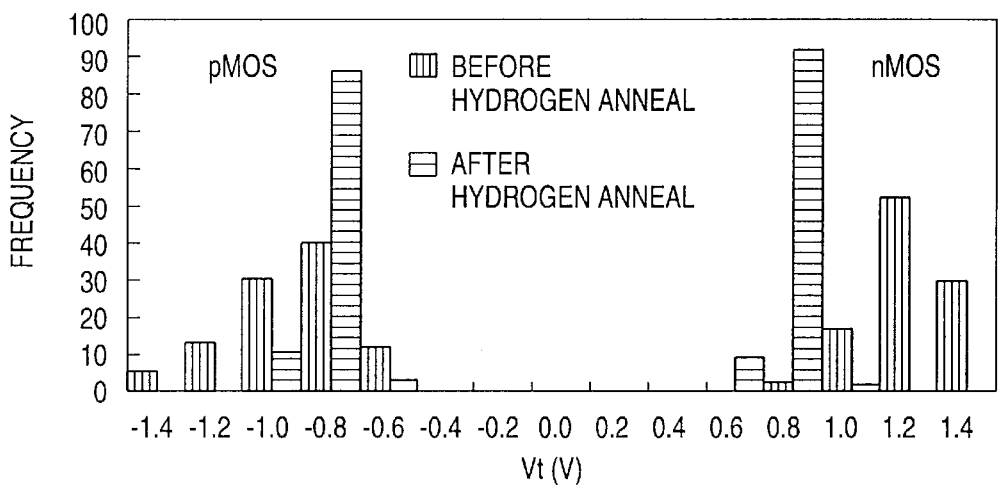
FIG. 14 shows a frequency distribution of Vt measuring value before and after hydrogen anneal of the semiconductor device (transistor) illustrated in FIG. 1.

FIG. 14 shows a frequency distribution of measured Vt-value before and after the hydrogen anneal (in the case of nMOS and pMOS transistors) for the semiconductor device illustrated in FIG. 1. It is found from the measurement results that the fluctuation of Vt after the hydrogen anneal is largely reduced.

Figure 15:
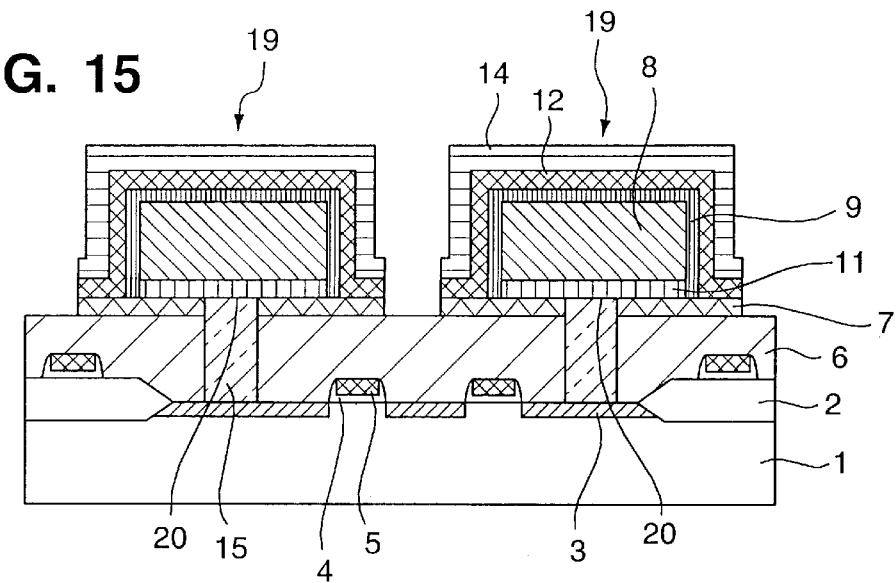
FIG. 15 is a side cross-sectional view showing a basic structure of a semiconductor device according to a second embodiment of this invention.

FIG. 15 shows a side cross-sectional view showing the basic structure of a semiconductor device according to a second embodiment of this invention.

A device isolation oxide film 2, an interlayer insulating film 6 having a plug 15, a hydrogen barrier film 7, a hydrogen barrier film 11, a lower electrode 8, a capacitor insulating film 9, a hydrogen barrier film 12 and a wiring layer 14 are deposited in this order on a silicon substrate 1. In this case, a capacitor portion 19 comprising the lower electrode 8 and the capacitor insulating film (dielectric film) 9 is completely covered with the hydrogen barrier films 7, 11 and 12, and a gate electrode 5 is formed on a gate oxide film 4 between impurity diffusion regions 3 in the silicon substrate 1. In this example, in contrast to the first embodiment, the lower electrode 8 is connected to a source and a drain of a selection transistor via plug 15. As in the first embodiment, however, the capacitor portion 19 is covered with the hydrogen barrier films 7, 11, and 12, and the hydrogen barrier films, except on the capacitor portion 19, are removed. Although the capacitor portion 19 substantially overlaps the transistor portion, as shown in FIG. 15, and the hydrogen barrier films 7, 11, and 12 are located above the transistor portion, the MOS characteristic is ensured by the hydrogen anneal because the hydrogen sufficiently diffuses from the portion between the capacitor portions 19 from which the hydrogen barrier is removed.

FIGS. 16–24 are side cross-sectional views showing a method of manufacturing the semiconductor device of FIG. 15 for each manufacturing step.

Figure 16:
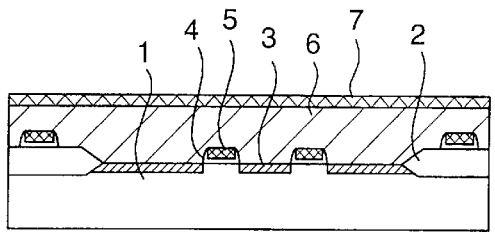
FIGS. 16–24 are side cross-sectional views showing a method of manufacturing the semiconductor device illustrated in FIG. 15 with each manufacturing step.
Figure 17:
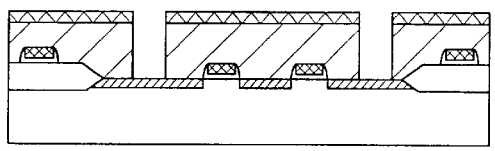
Figure 18:
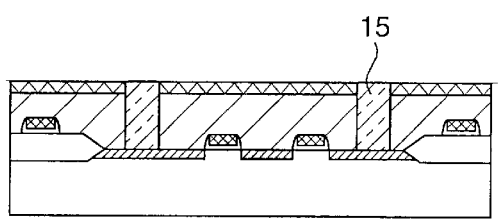

First, as shown in FIG. 16, a first barrier film 7 is formed in the same sequence as the first embodiment, and as shown in FIG. 17, a contact hole is formed by the etching. Thereafter, as shown in FIG. 18, a plug 15 is formed by an etch back after polysilicon is deposited by using a CVD method.

Figure 19:
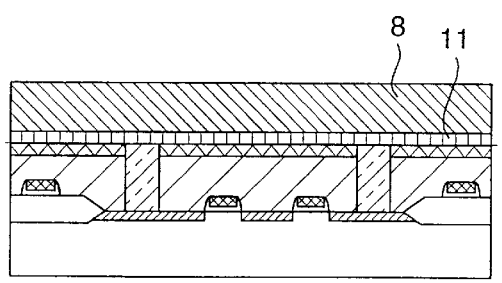

Next, as shown in FIG. 19, the second barrier film 11 and the lower electrode 8 are deposited. TiN, TaN and the like are used as the hydrogen barrier film 11 because it must be conductive. The barrier film 11 has a film thickness of 100 Å or more to obtain sufficient barrier performance. For example, the hydrogen-barrier film 11 of TaN having a film thickness of 500 Å and the lower electrode 8 of Ru are deposited by a sputtering method.

Figure 20:
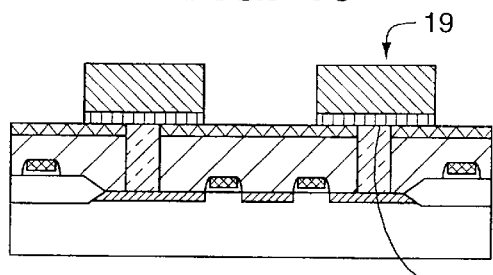
Figure 21:
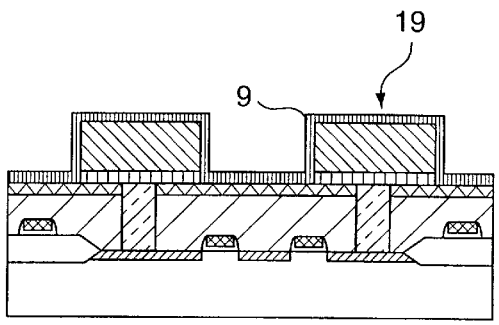
Figure 22:
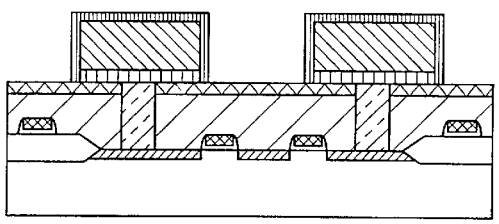

Further, as shown in FIG. 20, lower electrode 8 and the hydrogen barrier film 11 are processed by etching, followed by formation of the capacitor insulating film 9 thereon, as shown in FIG. 21. The capacitor insulating film 9 is processed by etching, as shown in FIG. 22. For example, after the hydrogen barrier film 11 of TaN film and the lower electrode 8 of Ru layer are etched, $(Ba,Sr)TiO_3$ is formed as the capacitor insulating film 9 by a CVD method. Thereafter, the etching process is carried out.

Figure 23:
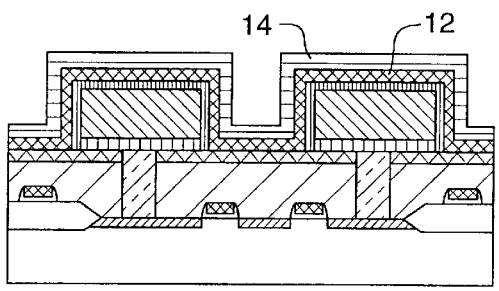

Successively, as shown in FIG. 23, the third barrier film 12, which is conductive, is formed, and the wiring layer 14 of a plate line layer is formed thereon. For example, the hydrogen barrier film 12 of TiN having a thickness of 500 Å is formed by the CVD method, and then polysilicon is formed as the plate line layer by CVD to obtain wiring layer 14. In this case, the CVD method used to form hydrogen barrier film 12 provides a film having excellent step coverage. In the formation of the wiring layer 14, polysilicon is formed in a reduction atmosphere in which the reaction represented by $SiH_4 \rightarrow Si+2H_2$ is performed. However, the capacitor insulating film 9 is not degraded because the hydrogen barrier film 12 of TiN film is in place.

Figure 24:
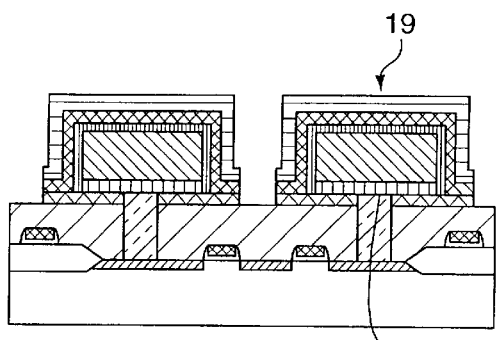

Subsequently, wiring layer 14 and hydrogen barrier films 12 and 7 are removed from between capacitor portions 19 by etching, as shown in FIG. 24. Thereafter, the second interlayer insulating film 13 and a wiring layer of Al (not shown) are formed thereon. Next, the hydrogen anneal is carried out at 400° C.

(Ba,Sr)TiO$_3$ of the capacitor insulating film 9 in the semiconductor device (nMOS and pMOS transistors) has a dielectric constant of about 300, and the fluctuation of Vt of the transistor is 10% or less in the case of both nMOS and pMOS.

Figure 25:
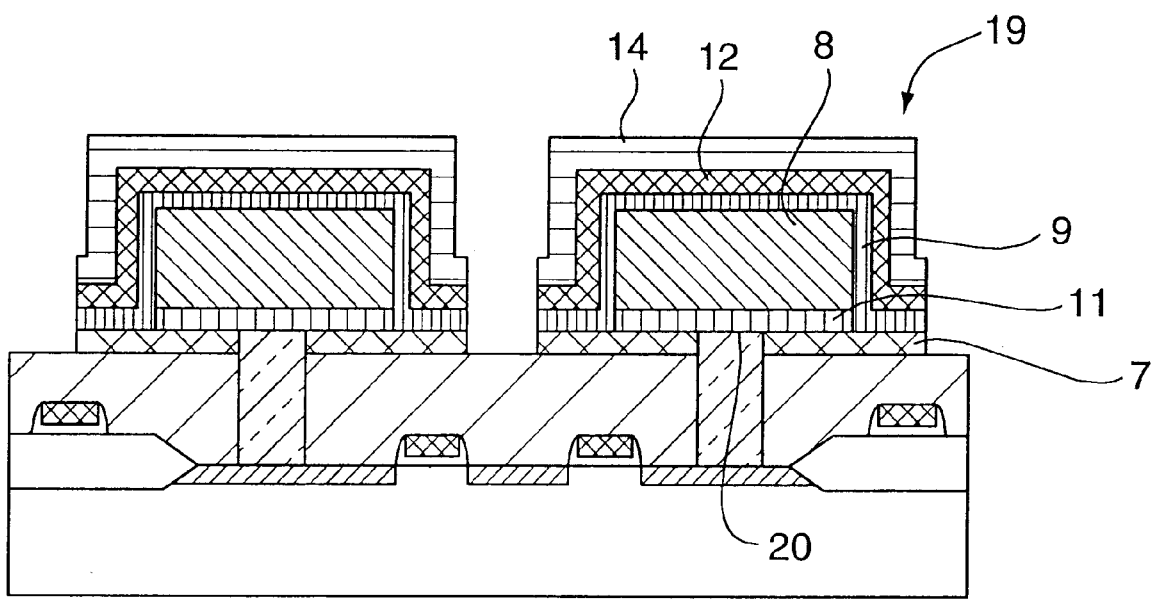
FIG. 25 is a side cross-sectional view showing a basic structure of a modified embodiment of the semiconductor device illustrated in FIG. 15.

FIG. 25 is a side cross-sectional view showing a basic structure according to one modified embodiment of the semiconductor device illustrated in FIG. 15. In such a semiconductor device, the etching process after the formation of the capacitor insulating film 9 is omitted, and the capacitor insulating film 9 is etched at the same time with the wiring layer 14. Basically, the same structure as the semiconductor device illustrated in FIG. 15 can be obtained using the above manufacturing step. This semiconductor device has the advantage of reducing the manufacturing steps. On the other hand, compared to the semiconductor device depicted in FIG. 15, the semiconductor device is subjected more to the damage arising from hydrogen because the capacitor insulating film 9 is exposed at the side. However, a small degree of deterioration can be permitted because the side portion, which does not contact with the lower electrode 8, does not function in the capacitor.

Figure 26:
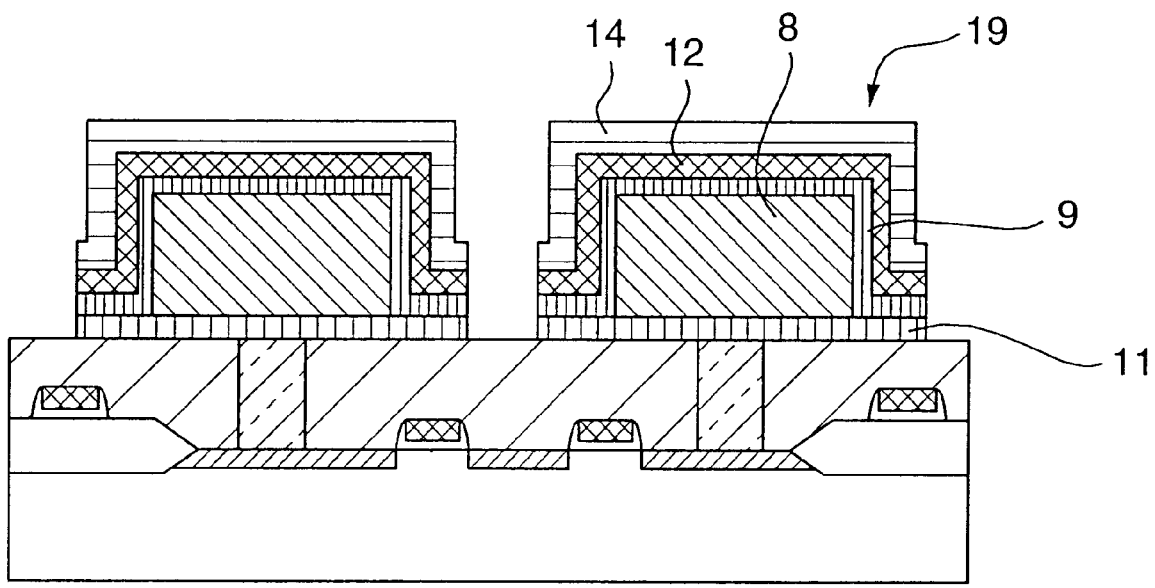
FIG. 26 is a side cross-sectional view showing a basic structure of another modified embodiment of the semiconductor device illustrated in FIG. 15.
Figure 27:
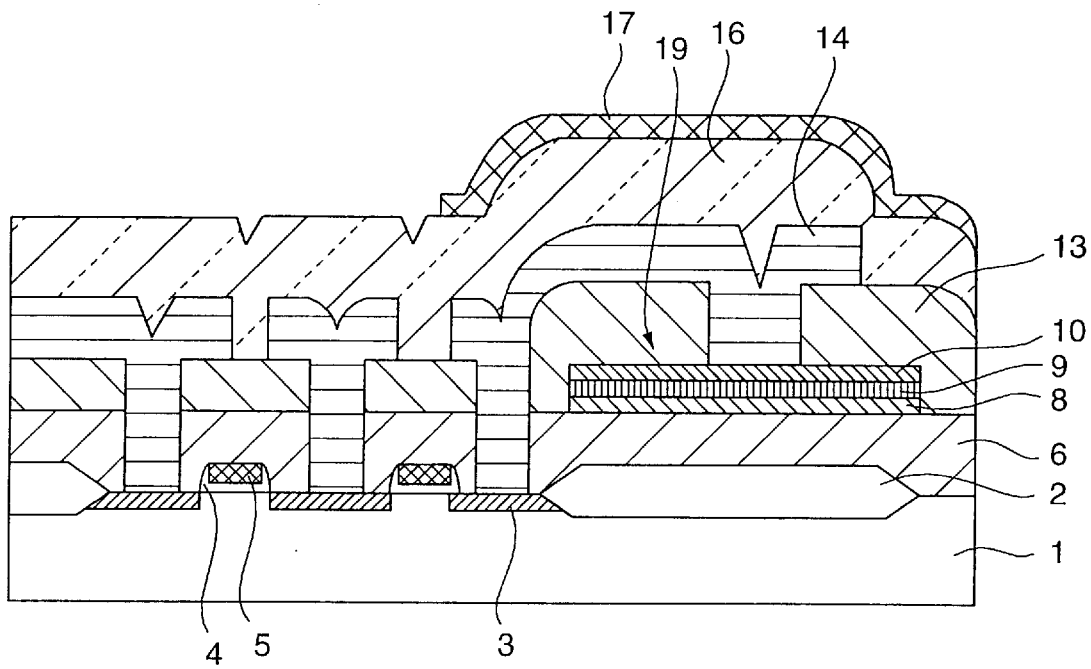
FIG. 27 is a side cross-sectional view showing a basic structure of a conventional semiconductor device in which a hydrogen barrier film is formed on an interlayer insulating film.
Figure 28:
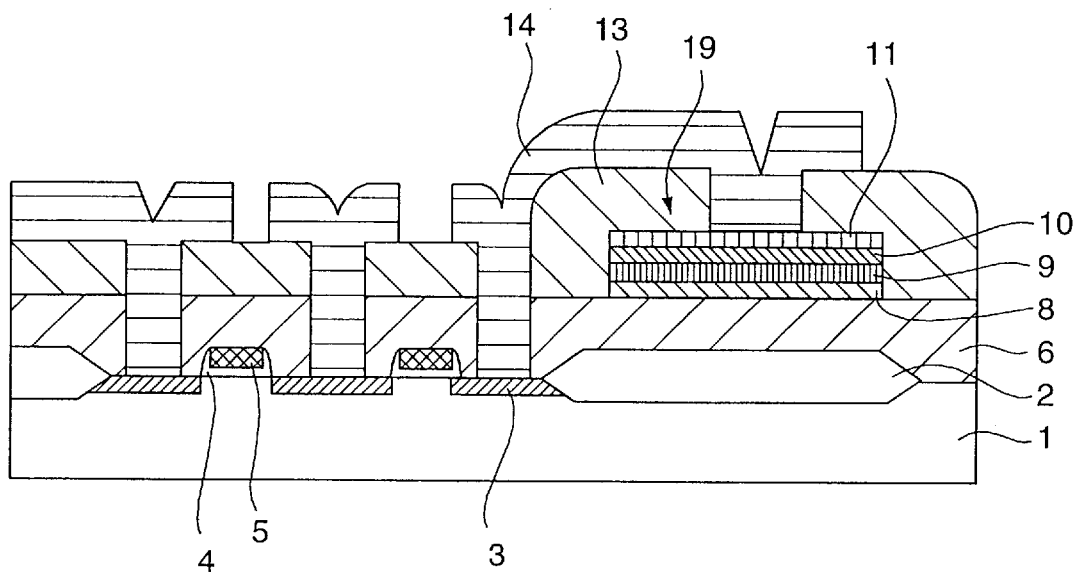
FIG. 28 is a side cross-sectional view showing a basic structure of another conventional semiconductor device in which a hydrogen barrier film is formed on the upper electrode of the device.
Figure 29:
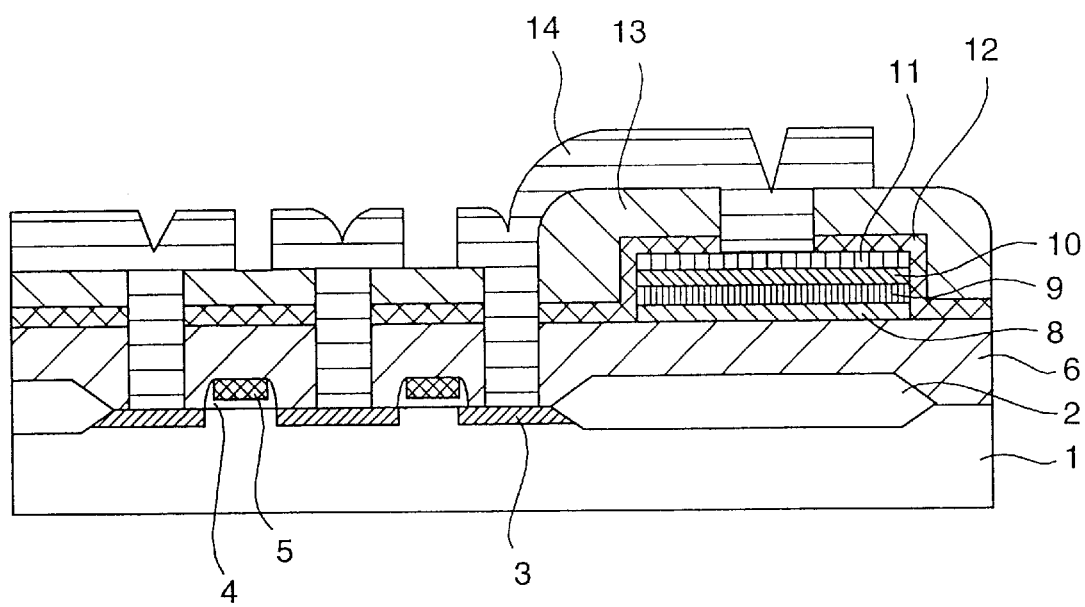
FIG. 29 is a side cross-sectional view showing a basic structure of another conventional semiconductor device in which a hydrogen barrier film is formed on the entire surface of the device.

FIG. 26 is a side cross-sectional view showing a basic structure according to another modified embodiment of the semiconductor device depicted in FIG. 15. In such a semiconductor device, in contrast to the semiconductor device of FIG. 15, the first hydrogen film 7 is omitted and the second hydrogen barrier film 11 is etched at the same time as wiring layer 14. Basically, the same structure as the semiconductor device illustrated in FIG. 15 can be obtained by using the above manufacturing process. In this event, although the capacitor insulating film 9 is exposed at the side surface, as in the semiconductor device of FIG. 25, this semiconductor device has the advantage that the manufacturing process can be shortened.

As described above, the deterioration of the capacitor insulating film (dielectric film) due to the hydrogen can be completely prevented, and further, excellent capacitance characteristics can be obtained in the semiconductor devices and with the manufacturing methods of this invention, despite manufacturing steps in a reduction atmosphere. Consequently, the yield can be increased as a result of increments of the operating margin. In addition, excellent capacitance characteristics can be obtained because the capacitor portion 19 is directly covered with the hydrogen barrier film. Further, the manufacturing process can be performed using a CVD method for depositing W after the formation of the capacitor portion 19, without increasing the size of the hydrogen barrier film with respect to the capacitor portion 19. Consequently, the cell area necessary for the capacitor portion 19 can be reduced, and a contact portion 20 having a high aspect ratio can be formed. In addition, the characteristic deterioration of the capacitor portion 19 with time can be prevented, and the reliability can be improved because the hydrogen barrier film has a high barrier performance for the water in addition to hydrogen.

There has been described a method for fabricating ferroelectric integrated circuits that permits exposure to hydrogen and still results in ferroelectric devices with good electrical properties. It should be understood that the particular embodiments shown in the drawings and described within this specification are for purposes of example and should not be construed to limit the invention which will be described in the claims below. Further, it is evident that those skilled in the art may now make numerous uses and modifications of the specific embodiments described, without departing from the inventive concepts. It is also evident that the steps recited may, in some instances, be performed in a different order; or equivalent structures and processes may be substituted for the various structures and processes described. Consequently, the invention is to be construed as embracing each and every novel feature and novel combination of features present in and/or possessed by the fabrication processes, electronic devices, and electronic device manufacturing methods described.

I claim:

1. A semiconductor device comprising:
    a substrate, said substrate forming a substrate plane;
    a transistor portion having a gate oxide film on said substrate, a gate electrode on said gate oxide film, and an impurity diffusion region;
    a capacitor portion having a top, a lower electrode and a capacitor insulating film, said lower electrode having an electrode upper surface and an electrode side surface, said capacitor insulating film having an insulator side surface, and said capacitor insulating film being located on said electrode upper surface; said capacitor insulating film comprising a material selected from the group consisting of a ferroelectric substance material or a high dielectric constant material, said top of said capacitor portion having a contact portion for electrically contacting said impurity diffusion region to said capacitor portion, said capacitor portion and said transistor portion not overlapping each other on said substrate plane;
    a first nonconductive hydrogen barrier film, said first nonconductive hydrogen barrier film being located under said lower electrode;
    a second nonconductive hydrogen barrier film, said second nonconductive hydrogen barrier film covering said top of said capacitor portion except for said contact portion, and further covering said insulator side surface and said electrode side surface; and
    a conductive hydrogen barrier film, said conductive hydrogen barrier film located on said top of said capacitor portion and covering said contact portion;
    whereby no hydrogen barrier film is located over said transistor portion.

2. A semiconductor device as in claim 1, wherein said conductive hydrogen barrier film comprises at least one selected from the group consisting of nitrides of Ti, Zr, Nb, Ta, Hf and W.

3. A semiconductor device as in claim 1, wherein said first and said second nonconductive hydrogen barrier film comprises at least one selected from the group consisting of Si$_3$N$_4$, SiON and a combination of Si$_3$N$_4$, SiON and SiO$_2$.

4. A semiconductor device as in claim 1, further comprising:
    an upper electrode.

5. A semiconductor device comprising:
    a substrate;
    a transistor portion, said transistor portion having a gate oxide film on said substrate, a gate electrode on said gate oxide film, and an impurity diffusion region;
    a plurality of capacitor portions, each of said capacitor portions having a top, a lower electrode and a capacitor insulating film, said lower electrode having an electrode upper surface and an electrode side surface, said capacitor insulating film covering said electrode upper surface, said capacitor insulating film having an insulator side surface, said insulator side surface covering said electrode side surface, said capacitor insulating film comprising a material selected from the group consisting of a ferroelectric substance material or a high dielectric constant material, each of said capacitor portions formed on a plug electrically connected to said impurity diffusion region, and each of said capacitor portions having an electrode lower surface with a contact portion, said contact portion being electrically connected to said plug;

a first conductive hydrogen barrier film, said first conductive hydrogen barrier film located between said plug and said lower electrode and covering said electrode lower surface and said contact portion; and a second conductive hydrogen barrier film, said second conductive hydrogen barrier film covering said top of said capacitor portion and said insulator side surface;

whereby no hydrogen barrier film is located in a major portion of the region between said capacitor portions.

6. A semiconductor device as in claim 5, further comprising a nonconductive hydrogen barrier film, said nonconductive hydrogen barrier film located between said first conductive hydrogen barrier film and said substrate, and not covering said contact portion.

7. A semiconductor device as in claim 5, wherein said conductive hydrogen barrier film comprises at least one selected from the group consisting of nitrides of Ti, Zr, Nb, Ta, Hf and W.

8. A semiconductor device as in claim 5, wherein said first and said second nonconductive hydrogen barrier film comprises at least one selected from the group consisting of $Si_3N_4$, SiON and a combination of $Si_3N_4$, SiON and $SiO_2$.

9. A semiconductor device as in claim 5, further comprising:

an upper electrode.

* * * * *